(12) United States Patent  (10) Patent No.: US 7,006,360 B2
Kim  (45) Date of Patent: Feb. 28, 2006

(54) STACK-TYPE SEMICONDUCTOR PACKAGE HAVING ONE OR MORE SEMICONDUCTOR PACKAGES STACKED THEREIN

(75) Inventor: Ji Yon Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 248 days.

(21) Appl. No.: 10/619,704

(22) Filed: Jul. 15, 2003

(65) Prior Publication Data

US 2004/0012096 A1  Jan. 22, 2004

(30) Foreign Application Priority Data

Jul. 16, 2002  (KR) ...................... 10-2002-0041562

(51) Int. Cl.
*H01R 12/16* (2006.01)
(52) U.S. Cl. ..................... 361/790; 361/803; 257/686
(58) Field of Classification Search ........ 361/772–774, 361/790, 803, 816–818; 174/259–261, 35 R; 257/685–686, 700–704, 723–724, 777–778, 257/696
See application file for complete search history.

(56) References Cited

U.S. PATENT DOCUMENTS

| 4,437,235 | A | * | 3/1984 | McIver ........................ 29/840 |
| 5,290,971 | A | * | 3/1994 | Hamaguchi et al. ........ 174/267 |
| 5,438,224 | A | * | 8/1995 | Papageorge et al. ........ 257/777 |
| 5,977,626 | A | * | 11/1999 | Wang et al. ................. 257/707 |
| 6,014,316 | A | | 1/2000 | Eide |
| 6,084,780 | A | * | 7/2000 | Happoya ..................... 361/767 |
| 6,487,078 | B1 | * | 11/2002 | Kledzik et al. .............. 361/704 |
| 6,528,353 | B1 | * | 3/2003 | Suh et al. .................... 438/121 |

* cited by examiner

*Primary Examiner*—Kamand Cuneo
*Assistant Examiner*—Tuan Dinh
(74) *Attorney, Agent, or Firm*—Ladas & Parry LLP

(57) ABSTRACT

One or more semiconductor devices are packaged inside a stack-type semiconductor package. The stack-type semiconductor package has a printed circuit board having a circuit pattern. A first semiconductor memory device (first device) is stacked on the PCB and is electrically connected to the PCB circuit pattern. A conductive frame has first terminals and second terminals, and the first terminals are electrically connected to the PCB circuit pattern. A second semiconductor memory device (second device) is stacked on the conductive frame over the first device and is electrically connected to second terminals of the conductive frame. The second device is electrically connected to the PCB circuit pattern and the first device via the conductive frame. Each of the first device may be either a ball grid array type stack package (BGA package) or a thin-small-outline-package-type package. The second device may be a BGA package.

29 Claims, 6 Drawing Sheets

500
502
504

506

STACK-TYPE SEMICONDUCTOR PACKAGE HAVING ONE OR MORE SEMICONDUCTOR PACKAGES STACKED THEREIN

BACKGROUND OF THE INVENTION

1. Field of the Invention

This application relates generally to a stack-type semiconductor package, and more particularly to a semiconductor device having one or more semiconductor packages (such as a ball grid array (BGA) package, a thin small outline package (TSOP), and various other packages or chips) stacked therein.

2. Description of the Prior Art

In the art of semiconductor chip packaging, the stack packaging techniques are used to increase the chip density or the memory storage capacity. According to these techniques, two or more semiconductor chips or packages, for example, are stacked on a substrate to form a single semiconductor package, and this type of stack packaging increases the chip density of the resulting packaged semiconductor chip.

One of the known stack packaging techniques is the chip stack package (CSP) technique where the unpackaged chips are stacked and aligned into one semiconductor package. This increases the chip density of the final semiconductor package/chip by about a factor of two.

The other type of known packaging technique is packaging two packaged semiconductor chips into one semiconductor package. For example, two semiconductor packages may be stacked and packaged into a single semiconductor package, and this would also increase the chip density by about a factor two.

FIG. 1 illustrates one type of the CSP-type semiconductor package. As shown, two unpackaged chips 102 and 104 are stacked and aligned on a substrate 106 into a single CSP semiconductor package. The size of each unpackaged chip 102 or 104 is different from the other. On the top surface near the peripheral edges of each chip 102 or 104, active surfaces having a plurality of bonding pads (not shown) are formed. The stacked, unpackaged chips 102 and 104 are then wire-bonded from the bonding pads (not shown) of the chips 102 and 104 to the substrate 106 as the bonding wires are shown in FIG. 1. In this manner, the stacked unpackaged chips 102 and 104 on the substrate 106 are packaged into a single CSP-type semiconductor package.

Another variation of the known CSP technique is shown in FIG. 2. Similar to FIG. 1, two unpackaged chips 204 and 202 are stacked and aligned on a substrate 206 into a single CSP-type stacked semiconductor package. However, instead of using bonding wires, the lower chip 202 is connected to a substrate 206 by using an anisotropic conductive film or a non-conductive film via a set of terminals 208 (such as bumps) formed on the lower chip 202. The upper chip 204 is wire-bonded to the substrate 206 in the similar manner as shown in FIG. 1.

The CSP packaging technique presents several problems and drawbacks. Because the chips that are packaged inside a conventional CSP-type semiconductor package are not packaged, they are subjected to and passed only a probe test, which is not a predictable and reliable measure of determining the package yield rate of the final semiconductor packages. This is because a fault that existed in an unpackaged chip before it is subjected to the CSP technique is almost impossible to detect during the CSP packaging process.

The package yield rate of the CSP technique is typically much less than the yield rate of semiconductor packages/chips produced without utilizing a CSP technique. For example, if the package yield rate of the semiconductor packages/chips produced without utilizing the CSP technique is eighty percent (for example, per one lot of a wafer), the yield rate of the packages/chips produced in a CSP packaging process would typically be about 64%.

The CSP technique is generally intended for producing semiconductor packages in a niche market, because the CSP technique is generally advantageous to a manufacturer who produces the semiconductor packages in small quantities to a particular niche market consumer demand. Nevertheless, this causes the manufacturer to be susceptible to the risks of the fluctuating market demands.

FIG. 3 is a side view showing the conventional technique of packaging two conventional TSOP-type stack packages into a singe package. As shown, two TSOP packages 302 and 304 are stacked to increase the chip density.

This conventional technique also has several limitations. For example, the data bandwidth of a TSOP-type stack package is fixed, and this places limits on the amount of the chip density that can be increased.

In addition, the number of leads in a conventional TSOP-type stack package cannot be increased. So the chips contained in the upper and lower packages 302 and 304 are separately connected to a chip select pin (not shown) and a no-connection pin (not shown). Thus, the final semiconductor package requires an additional no-connection pin.

Further, the two TSOP packages 302 or 304 that are stacked in a final package must be of the same size so that the leads of each package 302 or 304 are arranged in the same position. This conventional packaging technique does not provide ways for packaging two different types of packages into one final semiconductor package or two differences sizes of packages into one final semiconductor package.

Accordingly, there is a need for a method and apparatus for providing a stack-type semiconductor package that contains one or more semiconductor chips and/or packages stacked therein and solves the problems associated with the conventional packaging techniques.

SUMMARY OF THE INVENTION

Against this backdrop, embodiments of the present invention have been developed. In these embodiments, a stack-type semiconductor package has one or more semiconductor devices/packages packaged inside while eliminating or minimizing the problems associated with those of the prior art.

A stack-type semiconductor package has a printed circuit board (PCB) having a circuit pattern. A first semiconductor memory device (first device) is stacked on the PCB and is electrically connected to the PCB circuit pattern.

A conductive frame has first terminals and second terminals. The first terminals are electrically connected to the PCB circuit pattern.

A second semiconductor memory device (second device) is stacked on the conductive frame over the first device and is electrically connected to the second terminals of the conductive frame. The second device is electrically connected to the PCB circuit pattern and the first device via the conductive frame.

According to an embodiment of the present invention, each of the first and second devices is a ball grid array type stack package (BGA package) having a plurality of solder balls at its lower surface.

According to another embodiment of the present invention, the first device is a thin-small-outline-package-type semiconductor package (TSOP package) having a plurality of TSOP leads for electrical connection to the PCB circuit pattern, and the second device is a ball grid array type stack package (BGA package) having a plurality of solder balls at its lower surface.

The conductive frame may be a lead frame or a tape automated bonding (TAB) tape. As to the lead frame, the lead frame has a plurality of elongated lead parts, and each elongated lead part has a ball land at one end and a lead section at the other end. The ball lands comprise the second terminals and are arranged in a predetermined pattern to correspond to the solder balls of the second device. The lead sections comprise the first terminals and are electrically connected to the PCB circuit pattern.

As to the TAB tape, the first terminals are formed at the two ends of the TAB tape, and the first terminals are electrically connected to the PCB circuit pattern. The second terminals of the TAB tape are formed at the middle portion of the TAB tape and are arranged in a predetermined pattern to correspond to the solder balls of the second device.

The first terminals of the TAB tape are electrically connected to the PCB pads by a thermal compression process or a supersonic compression process. The middle portion of the TAB tape is adhesive by having a thermoplastic resin, an adhesive glass, or an adhesive tape on its surface.

These and various other features as well as advantages which characterize the present invention will be apparent from a reading of the following detailed description and a review of the associated drawings.

DETAILED DESCRIPTION

Generally, an embodiment of the present invention is described with reference to FIGS. 4 and 5A–5B (relating to the parts and components) and FIGS. 6A–6C (relating to the manufacturing process). Another embodiment of the present invention is described with reference to FIG. 7.

Figure 1:
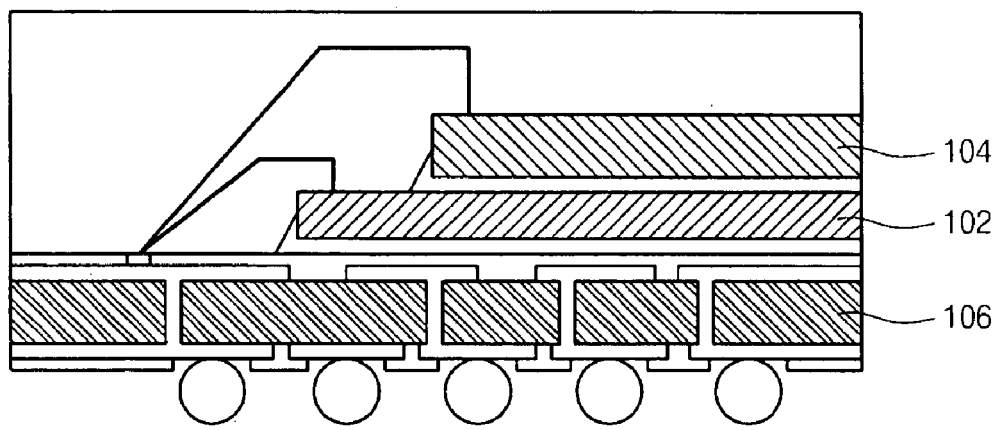
FIG. 1 is a cross-sectional view showing one type of the conventional CSP-type semiconductor package.
Figure 2:
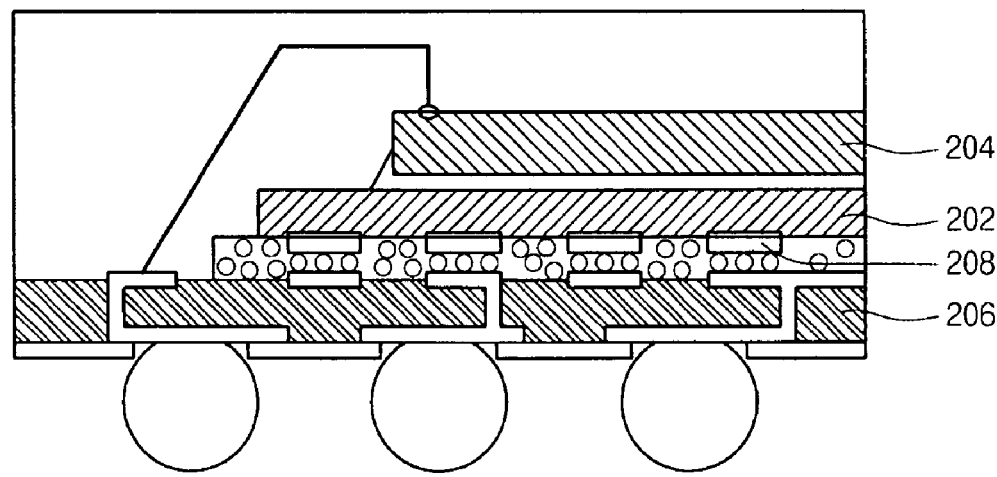
FIG. 2 is a cross-sectional view showing another type of the conventional CSP-type semiconductor package.
Figure 3:
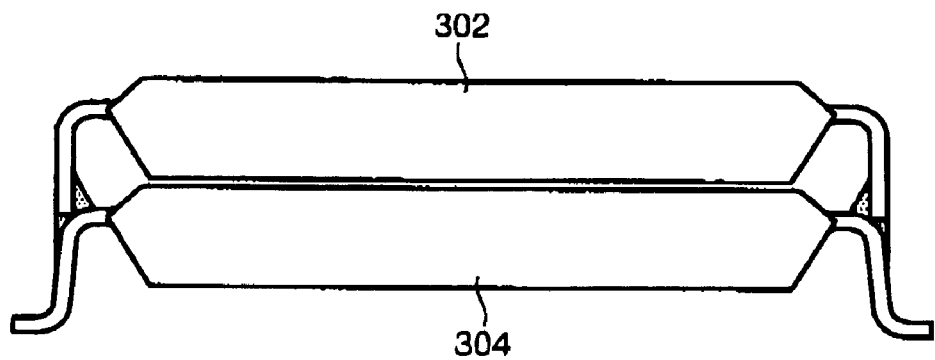
FIG. 3 is a side view showing the conventional TSOP-type stack package.
Figure 4:
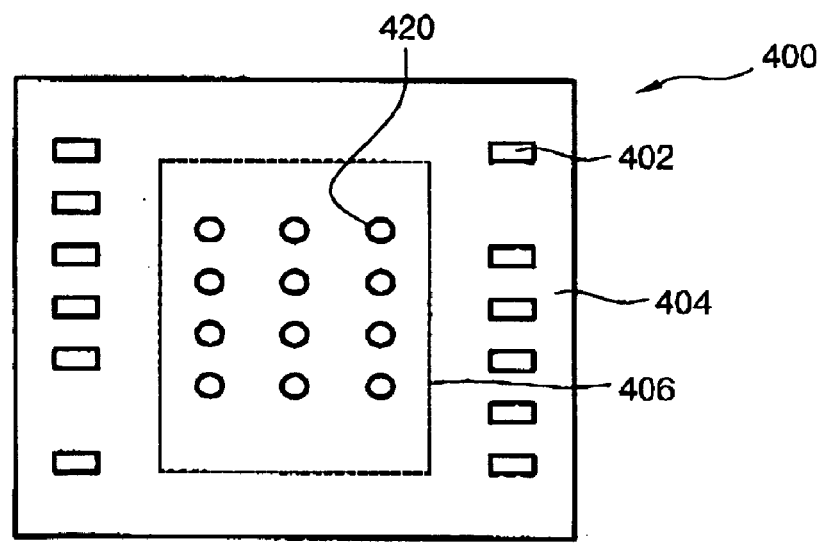
FIG. 4 is a plan view showing a printed circuit board according to an embodiment of the present invention.

FIG. 4 is a plan view showing a printed circuit board 400 according to an embodiment of the present invention. Above the printed circuit board 400, one or more semiconductor devices (which may be packaged or unpackaged semiconductor chips) can be stacked. A lower semiconductor device (not shown) would be stacked on or above the printed circuit board 400, and an upper semiconductor device would be stacked on or above the lower semiconductor device. A conductive frame (not shown) would be mounted or placed between the upper and lower semiconductor devices. The conductive frame (not shown) electrically connects the upper semiconductor device to the lower semiconductor device and/or the printed circuit board 400.

For purposes of describing the various embodiments of the present invention, two semiconductor packages (i.e., the lower semiconductor package and the upper semiconductor package) will be referred to as being stacked above the printed circuit board such as 400 to produce the final stack-type semiconductor packages. However, it would be well known to those skilled in the pertinent art that any semiconductor devices (whether they are packaged or unpackaged) can be used for stacking instead of or together with the semiconductor packages. Two examples of the semiconductor packages are a ball grid array type stack package (hereinafter "the BGA package") and a thin small outline package (herinafter "the TSOP package"), and they can be stacked on the substrate 400 to produce the final stack-type semiconductor package.

Referring again to FIG. 4, the printed circuit board 400 includes a central region 406 and a peripheral region outside the central region 406.

A plurality of pads 402 is formed in the peripheral region. The pads 402 are used to electrically connect the upper and lower packages (not shown) that are stacked on or above the printed circuit board 400.

The central region 406 has a plurality of ball lands 420, and these ball lands receives the solder balls of the lower semiconductor package (not shown) stacked above the printed circuit board 400 for electrical connection. The ball lands 420 in the central region 406 are also electrically connected to the pads 402 by a circuit pattern (not shown) of the printed circuit board 400. The PCB circuit pattern (not shown) is predetermined according to the connection relationship between the terminals of the upper semiconductor package (not shown) and the lower semiconductor package (not shown). This PCB circuit pattern is made from copper (Cu) or other similar conductive materials.

Figure 5A:
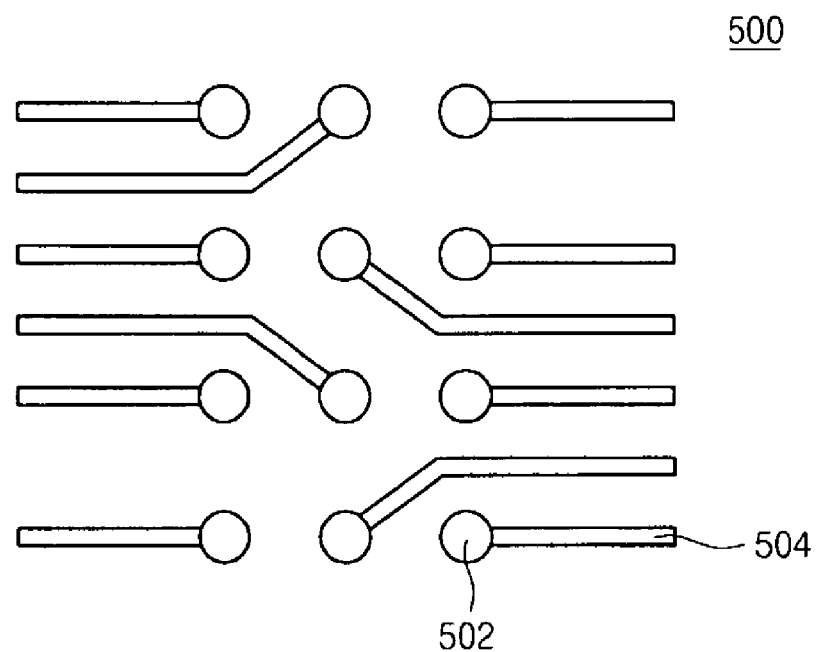
FIG. 5A is a plan view showing a lead frame according to an embodiment of the present invention.

One type of the conductive frame, known as a lead frame 500 is shown in FIG. 5A. FIG. 5A is a plan view showing the lead frame 500 according to an embodiment of the present invention, and FIG. 5B is a side view of the lead frame 500 according to the same embodiment of the present invention. As already discussed, the lead frame 500 is one type of a conductive frame that is used to electrically connect one stacked component to another component inside a final semiconductor package, for example, one semiconductor package to another semiconductor package and/or to the printed circuit board 400. (Another type of the conductive frame known as the tape automated bond (TAB) tape is also described later in this disclosure.)

Figure 5B:
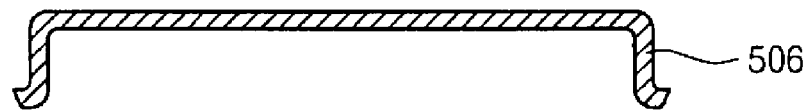
FIG. 5B is a side view showing a lead frame according to an embodiment of the present invention.

As shown in FIGS. 5A–5B, the lead frame 500 includes a plurality of elongated lead parts 504 and ball lands 502. One ball land 502 is formed at one end of each elongated lead part 504. The other end of each elongated lead part 504 is a lead section 506 (FIG. 5B). The ball lands 502 of the lead frame 500 would be placed between the stacked upper and lower semiconductor packages (not shown), and the ball lands 502 are used to receive the plurality of solder balls that are formed on the lower or bottom surface of the upper semiconductor package (not shown). The pattern of the elongated lead parts 504 is determined according to the connection relationship between the terminals of the stacked lower and upper semiconductor packages (not shown).

The lead sections 506 are electrically connected to the pads 402 of the printed circuit board 400. As already discussed above, some of the pads 402 are electrically connected to the lower semiconductor package (not shown). In this manner, the upper semiconductor package (not shown) is electrically connected to the printed circuit board 400 and/or the lower semiconductor package (not shown) through the lead frame 500.

Figure 6A:
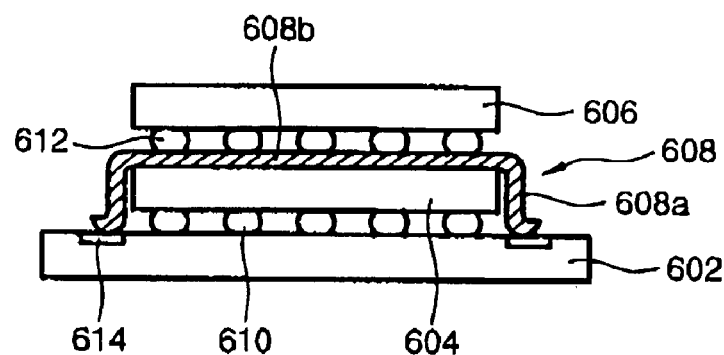
FIGS. 6A–6C are views showing a manufacturing process of a stack-type semiconductor package according to an embodiment of the present invention.
Figure 6B:
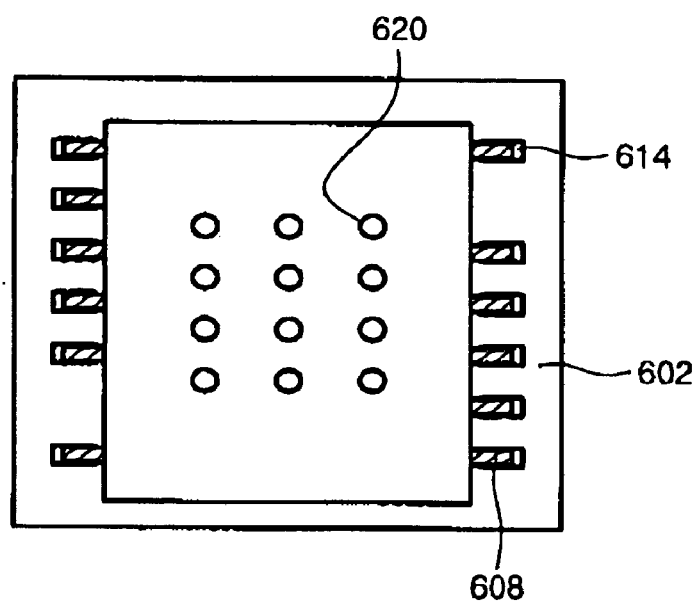
Figure 6C:
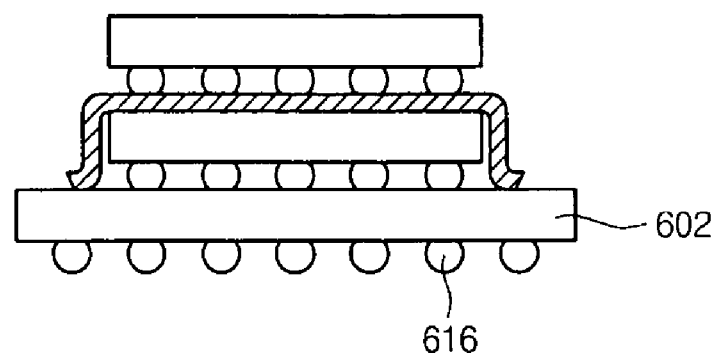

The component features as well as the overall manufacturing processes of the stack-type semiconductor package according to an embodiment of the present invention are described with respect to FIG. 6A–6C.

As shown in FIGS. 6A–6B, a first semiconductor package 604 (for example, a BGA package) is mounted on the upper surface of a printed circuit board 602. The first semiconductor package 604 has a lower surface having a plurality of solder balls 610. In the similar manner as already described above with respect to FIG. 4, the central region of the printed circuit board 602 has a plurality of ball lands 620. The solder balls 610 of the first semiconductor package 604 are electrically connected to the ball lands 620 of the printed circuit board 602. On the lower surface of the printed circuit board 602, a plurality of ball lands 620 are also formed, and more about this aspect is described below with respect to FIG. 6C.

Now referring again to FIGS. 6A–6B, a lead frame 608 is then placed on or above the first semiconductor package 604. In the similar manner as already described with respect to FIGS. 5A–5B, the lead frame 608 has a plurality of elongated lead parts (not shown) and a plurality of lead sections 608a. A plurality of pads 614 are formed on the printed circuit board 602, and the lead sections 608a are electrically connected to the pads 614. A ball land (not shown) is formed at the other end of each elongated lead part (not shown) of the lead frame 608 in the similar manner as already described above with respect to FIGS. 5A–5B.

A second semiconductor package 606 (for example, a BGA package) is mounted on the lead frame 608. The second semiconductor package 606 has a plurality of solder balls 612 at its lower surface, and the solder balls 612 are attached to the ball lands (not shown) of the lead frame 608.

Then, a solder paste (not shown) is coated on the pads 614, and a single reflow process is carried out with respect to the solder balls 610 and 612 and the solder paste (not shown). This provides good electrical connection between the lead sections 608a and the pads 614; between the first semiconductor package 604 and the printed circuit board 602 via the solder balls 610; and between the second semiconductor package 606 and the lead frame 608 via the solder balls 612.

Next, as shown in FIG. 6C, a plurality of solder balls 616 are attached to or formed on the ball lands at the lower surface of the printed circuit board 602.

According to an embodiment of the present invention, the solder balls 610, 612 and 616 include tin (Sn) as the main material and may also additionally include lead (Pb), Silver (Ag), 1) indium (In), bismuth (Bi), gold (Au), zinc (Zn), copper (Cu), or antimony (Sb), which is selectively added to 2) one or any combination. Preferably, the size of each of the solder balls 610, 612, and 616 is set in a range about 100 μm to about 1 mm. Nevertheless, it would be well known to those skilled in the art that other conductive materials can be used instead to form the solder balls of the same or other sizes.

The ball lands (not shown) of the lead frame 608 receive the solder balls 612 of the second semiconductor package 606. The lead sections 608a are electrically connected to the pads 614 of the printed circuit board 602. The lead sections 608a and/or the pads 614 are generally coated with a conductive material to make the soldering work easier.

The main material for coating is Sn, and one or more of the following materials—Pb, Ag, In, Bi, Au, Zn, Cu, Palladium (Pd), and Ni—are selectively added to Sn in a predetermined amount(s) to increase the wet property of a solder.

According to a presently preferred embodiment of the present invention, a conductive bump (not shown) can be formed on the pads 614 to secure a connection between the lead frame 608 and the pads 614. The conductive bump (not shown) may be made from any electrically conductive material, such as and preferably Au or Ni. The size of the conductive bump (not shown) is determined based on the size of the pad 614 and the height of the conductive bump is in the range of about 1 μm to about 100 μ.

Figure 7:
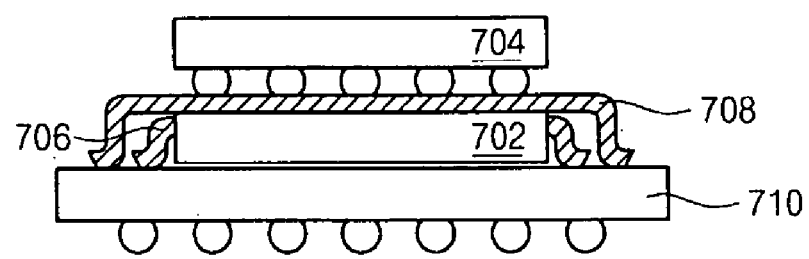
FIG. 7 is a view showing a stack-type semiconductor package according to another embodiment of the present invention.

According to another embodiment of the present invention as shown in FIG. 7, the stack-type semiconductor package may include a TSOP package and at least one BGA package, which are sequentially stacked on a printed circuit board. In this embodiment, a first semiconductor device 702 is stacked on the printed circuit board 710, and a second semiconductor device is stacked above the first semiconductor device 702 similar to the an embodiment described above with respect to FIGS. 6A–6b (and referring to 602, 604, and 606).

In this embodiment, however, a first semiconductor package 702 is electrically connected to a printed circuit board 710 through a plurality of leads 706 (instead of solder balls) provided in the first semiconductor package 702. This is different from the previous embodiment described above with respect to FIGS. 6A–6C that utilizes solder balls 610 (instead of the leads such as 702) to connect the first semiconductor device 604 to the printed circuit board 602.

The use of the leads 706 as in this embodiment described with respect to FIG. 7 provides advantages when the first semiconductor device 702 is a TSOP package. In contrast, the use of solder balls 610 (referring back to FIG. 6A as in the previous embodiment described with respect to FIGS. 6A–6C) provides advantages when the first semiconductor device 604 is a BGA package.

Now referring again to FIG. 7, a plurality of solder balls are attached to the bottom surface a second semiconductor device 704, and another plurality of solder balls are also attached to the bottom surface of the printed circuit board 710. The remaining other parts and features of the stack-type semiconductor package according to this embodiment of the present invention as described with respect to FIG. 7 are substantially identical to those of the stack-type semiconductor package shown in the previous embodiment described with respect to FIGS. 6A-6C. As such, those substantially similar parts and features are not redundantly described.

Figure 8:
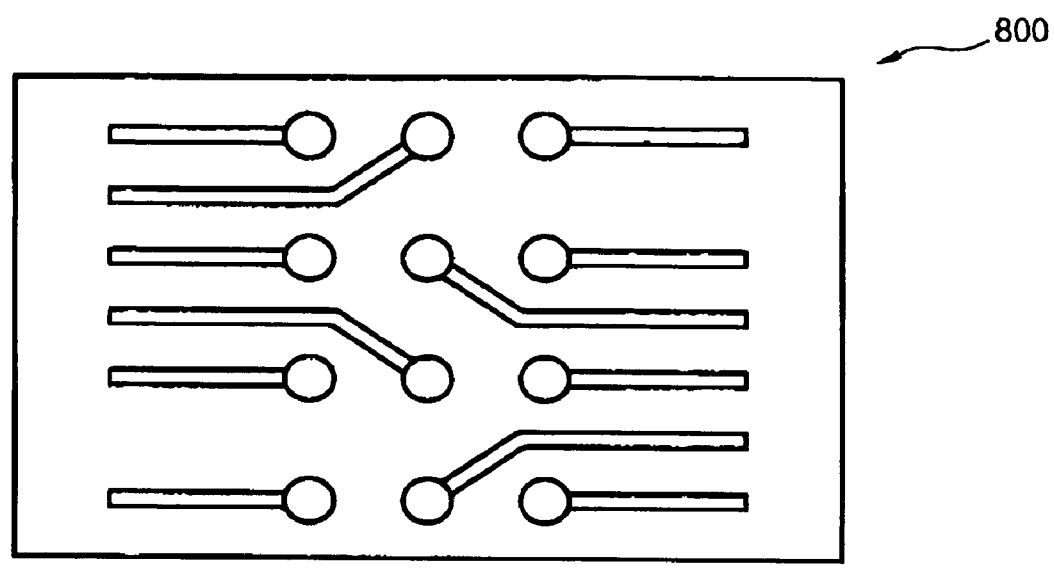
FIG. 8 is a top view showing a TAP tape according to an embodiment of the present invention.

Instead of the lead frames 608 and 708 as shown and described in the embodiments above with respect to FIGS. 6A–6C and 7, a conventional tape automated bonding tape 800 (hereinafter, "the TAB tape") can be used as the conductive frame to provide electrical connection as shown in FIG. 8. Thus, the second semiconductor device 606 or 704 can be electrically connected to the corresponding first semiconductor device 604 or 702 and to the corresponding printed circuit board 602 or 710 by means of the TAB tape 800. The TAB tape 800 would adhere to other the components such as the lower surface of the corresponding second semiconductor device 606 or 704 and make an electrical connection.

To accomplish this, the TAB tape has an adhesive portion made from an adhesive material of one (or any combination)

of an epoxy-based thermoplastic resin, an adhesive glass, and/or an adhesive tape. If the adhesive tape is used as the adhesive material, the thickness of the adhesive tape is in the range about 10 $\mu$m to about 100 $\mu$m, and a polymer having superior insulation characteristics is used as the material for the adhesive tape.

The two ends of the TAB tape are electrically connected to the pads on the printed circuit board 602 or 710 by a thermal compression process or a supersonic compression process.

As described above, the stack-type semiconductor package of the present invention as described in various embodiments above utilizes and is capable of utilizing the packaged semiconductor devices such as the BGA package and/or the TSOP package. It is also noted that unpackaged semiconductor chips may be utilized instead in the embodiments of the present invention to achieve the same or substantially similar results. The present invention provides several advantages in that the yield rate of the final stack-type semiconductor packages can be properly maintained. The stack-type semiconductor packages of the present invention can be more economically produced since, among other reasons, already developed packages are utilized as the stacking components inside the package. In addition, the reflow process may be carried out at once, so the reliability is improved.

Further, according to the present invention, a plurality of packages can be stacked regardless of the sizes or the types of the stacked packages. As already described above, the first semiconductor device 604 or 702 may be a BGA package or a TSOP package, and the second semiconductor device 606 or 704 may be a BGA package or a TSOP package. Depending on the type of the package used, a lead frame (such as 608 of FIG. 6A) or a lead (such as 706 of FIG. 7) may be used as the conductive frame to make the electrical connections.

Above all, the memory capacity of the semiconductor package is significantly improved as the semiconductor package is made by, inter alia, vertically stacking one or more semiconductor memory devices on a printed circuit board.

It will be clear that the present invention is well adapted to attain the ends and advantages mentioned as well as those inherent therein. While a presently preferred embodiment of the present invention has been described for purposes of this disclosure, various modifications may be made which are well within the scope of the present invention. Numerous changes may be made which will readily suggest themselves to those skilled in the art and which are encompassed in the spirit of the invention disclosed and as defined in the appended claims.

What is claimed is:

1. A stack-type semiconductor package having one or more semiconductor devices contained therein comprising:
    a printed circuit board (PCB) having a circuit pattern;
    a first semiconductor memory device (first device) stacked on the PCB and electrically connected to the PCB circuit pattern;
    a conductive frame having first terminals and second terminals, wherein the first terminals are electrically connected to the PCB circuit pattern;
    a second semiconductor memory device (second device) stacked on the conductive frame over the first device and electrically connected to second terminals of the conductive frame,
    wherein the second device is electrically connected to the PCB circuit pattern and the first device via the conductive frame,
    wherein the conductive frame is a lead frame having a plurality of elongated lead parts, each elongated lead part having a ball land at one end and a lead section at the other end,
    wherein the ball lands comprise the second terminals and are arranged in a predetermined pattern to correspond to the solder balls of the second device; and
    further wherein the lead sections comprise the first terminals and are electrically connected to the PCB circuit pattern.

2. The stack-type semiconductor package of claim 1, wherein each of the first and second devices is a ball grid array type stack package (BGA package) having a plurality of solder balls at its lower surface.

3. The stack-type semiconductor package of claim 1, wherein the first device is a thin-small-outline-package-type semiconductor package (TSOP package) having a plurality of TSOP leads for electrical connection to the PCB circuit pattern, and the second device is a ball grid array type stack package (BGA package) having a plurality of solder balls at its lower surface.

4. The stack-type semiconductor package of claim 2, wherein the PCB further comprises:
    pads for receiving the first terminals of the conductive frame to electrically connect the second device to the PCB circuit pattern and to the first device;
    ball lands for receiving solder balls of the first device to electrically connect the first device to the PCB circuit pattern; and
    a plurality of PCB solder balls to electrically connect the PCB to an external device.

5. The stack-type semiconductor package of claim 4, wherein each of the PCB pads are formed with a conductive bump.

6. The stack-type semiconductor package of claim 4, wherein the PCB circuit pattern is made from a conductive material including Cu.

7. The stack-type semiconductor package of claim 4, wherein the conductive frame is made from a conductive material including Cu or an alloy containing nickel (Ni) and iron (Fe).

8. The stack-type semiconductor package of claim 4, wherein the plurality of solder balls of the first and second devices and the plurality of PCB solder balls are made from a conductive material including Sn and one or any combination of the elements selected from the group consisting of Pb, Ag, In, Bi, Au, Zn, Sb, and Cu.

9. The stack-type semiconductor package of claim 5, wherein the conductive bump is made from a conductive material including Au or Ni and has a height of about 1 $\mu$m to about 100 $\mu$m.

10. The stack-type semiconductor package of claim 7, wherein the conductive frame is coated with a conductive material to enhance the electrical connection between the PCB and the first or second device, wherein the conductive material for coating includes Sn and one or any combination of the elements selected from the group consisting of Pb, Ag, In, Bi, Au, Zn, Cu, Pd, and Ni.

11. The stack-type semiconductor package of claim 7, wherein the alloy contains Ni and Fe in a ratio of 42:58 respectively by weight %.

12. The stack-type semiconductor package of claim 8, wherein the size of each of the plurality of solder balls of the first and second devices and the plurality of PCB solder balls is between about 100 µm and about 1 µm.

13. A stack-type semiconductor package having one or more semiconductor devices contained therein comprising:
   a printed circuit board (PCB) having a circuit pattern;
   a first semiconductor memory device (first device) stacked on the PCB and electrically connected to the PCB circuit pattern;
   a conductive frame having first terminals and second terminals, wherein the first terminals are electrically connected to the PCB circuit pattern;
   a second semiconductor memory device (second device) stacked on the conductive frame over the first device and electrically connected to second terminals of the conductive frame,
      wherein the second device is electrically connected to the PCB circuit pattern and the first device via the conductive frame.
      wherein the conductive frame is a tape automated bonding (TAB) tape,
      wherein the first terminals are formed at the two ends of the TAB tape and are electrically connected to the PCB circuit pattern; and
      further wherein the second terminals are formed at the middle portion of the TAB tape and are arranged in a predetermined pattern to electrically connect to the second device.

14. The stack-type semiconductor package of claim 13, wherein the PCB further comprises:
   first pads for receiving the first terminals of the conductive frame to electrically connect the second device to the PCB circuit pattern and to the first device;
   second pads for receiving the TSOP terminals of the first device to electrically connect the first device to the PCB circuit pattern; and
   a plurality of PCB solder balls to electrically connect the PCB to an external device.

15. The stack-type semiconductor package of claim 13, wherein each of the first and second devices is a ball grid array type stack package (BGA package) having a plurality of solder balls at its lower surface.

16. The stack-type semiconductor package of claim 13, wherein the first device is a thin-small-outline-package-type semiconductor package (TSOP package) having a plurality of TSOP leads for electrical connection to the PCB circuit pattern, and the second device is a ball grid array type stack package (BGA package) having a plurality of solder balls at its lower surface.

17. The stack-type semiconductor package of claim 14, wherein each of the PCB pads are formed with a conductive bump.

18. The stack-type semiconductor package of claim 14, wherein the PCB circuit pattern is made from a conductive material including Cu.

19. The stack-type semiconductor package of claim 14, wherein the conductive frame is made from a conductive material including Cu or an alloy containing nickel (Ni) and iron (Fe).

20. The stack-type semiconductor package of claim 14, wherein the plurality of solder balls of the first and second devices and the plurality of PCB solder balls are made from a conductive material including Sn and one or any combination of the elements selected from the group consisting of Pb, Ag, In, Bi, Au, Zn, Sb and Cu.

21. The stack-type semiconductor package of claim 15, wherein the PCB comprises:
   pads for receiving the first terminals of the conductive frame to electrically connect the second device to the PCB circuit pattern and to the first device; and
   ball lands for receiving solder balls of the first device to electrically connect the first device and the PCB circuit pattern; and
   a plurality of PCB solder balls to electrically connect the PCB to an external device.

22. The stack-type semiconductor package of claim 16, wherein the PCB comprises:
   first pads for receiving the first terminals of the conductive frame to electrically connect the second device to the PCB circuit pattern and to the first device; and
   ball lands for receiving solder balls of the first device to electrically connect the first device and the PCB circuit pattern; and
   a plurality of PCB solder balls to electrically connect the PCB to an external device.

23. The stack-type semiconductor package of claim 17, wherein the conductive bump is made from a conductive material including Au or Ni and has a height of about 1 µm to about 100 µm.

24. The stack-type semiconductor package of claim 19, wherein the conductive frame is coated with a conductive material to enhance the electrical connection between the PCB and the first or second device, wherein the conductive material for coating includes Sn and one or any combination of the elements selected from the group consisting of Pb, Ag, In, Bi, Au, Zn, Cu, Pd, and Ni.

25. The stack-type semiconductor package of claim 19, wherein the alloy contains Ni and Fe in a ratio of 42:58 respectively by weight %.

26. The stack-type semiconductor package of claim 21, wherein the first terminals of the TAB tape are electrically connected to the PCB pads by a thermal compression process or a supersonic compression process.

27. The stack-type semiconductor package of claim 22, wherein the first terminals of the TAB tape are electrically connected to the PCB pads by a thermal compression process or a supersonic compression process.

28. The stack-type semiconductor package of claim 26, wherein the middle portion of the TAB tape is adhesive by having a thermoplastic resin, an adhesive glass, or an adhesive tape on its surface.

29. The stack-type semiconductor package of claim 27, wherein the middle portion of the TAB tape is adhesive by having a thermoplastic resin, an adhesive glass, or an adhesive tape on its surface.

* * * * *